United States Patent
Tai

[19]

[11] Patent Number: 6,021,063
[45] Date of Patent: Feb. 1, 2000

[54] METHOD AND STRUCTURE FOR IMPROVING DATA RETENTION IN A DRAM

[75] Inventor: Jy-Der David Tai, Hsinchu, Taiwan

[73] Assignee: Vanguard International Semiconductor Corporation, Taiwan

[21] Appl. No.: 08/782,603

[22] Filed: Jan. 13, 1997

[51] Int. Cl.[7] .................................................. G11C 13/00
[52] U.S. Cl. ...................... 365/149; 365/189.01
[58] Field of Search .......................... 365/149, 189.01, 365/189.04, 189.09, 230.01, 230.06

[56] References Cited

U.S. PATENT DOCUMENTS 3,387,286  6/1968  Dennard ................................. 365/149

Primary Examiner—Terrell W. Fears
Attorney, Agent, or Firm—Christensen O'Connor Johnson & Kindness PLLC

[57] ABSTRACT

A DRAM memory cell with improved data retention includes an access transistor, a capacitor, and a configurable voltage generator. The configurable voltage generator provides a cell plate voltage of ½VDD during an active mode and VDD during a non-active mode. The higher cell plate voltage during the non-active mode provides strong wordline disturbance immunity without negatively biasing the wordline. Because the wordline is not negatively biased, power dissipation caused by cross-fails are reduced.

20 Claims, 3 Drawing Sheets

METHOD AND STRUCTURE FOR IMPROVING DATA RETENTION IN A DRAM

FIELD OF THE INVENTION

The present invention relates to dynamic random access memories (DRAMs) and, more specifically, to memory cell structures for improving the data retention of a DRAM cell.

BACKGROUND

DRAMs generally use a large number of memory cell capacitors in storing data. The data stored in each memory cell capacitor is typically accessed through a metal-oxide semiconductor field effect transistor (MOSFET). However, because a significant amount of charge will leak from the memory cell capacitors in typical conventional DRAM designs, the leakage of a memory capacitor in DRAM designs is a major issue. As is well known, DRAMs use memory refresh cycles to compensate for the capacitor leakage so as to retain data in the memory cells. However, memory refresh cycles consume power and time. To reduce refresh power or refresh rate, it is essential to reduce leakage of the memory capacitor.

Two major causes of the memory cell capacitor leakage are junction leakage and channel leakage caused by wordline disturbances. Junction leakage is the result of the reverse saturation current of the access transistor of the memory cell, which leaks to the substrate. As is well known, the reverse saturation current of a MOSFET is strongly dependent on process parameters.

On the other hand, the channel leakage caused by wordline disturbances results when noise from a noise source (e.g., switching noise on nearby wordline) is coupled to the wordline. Because the wordline is typically connected to the gate of the access transistor, the coupled noise may cause the access transistor to become momentarily conductive. Consequently, charge stored in the cell capacitor may leak if the capacitor is charged (e.g., storing a high voltage), or charge may enter the capacitor from the bitline if the capacitor is discharged (e.g., storing a low voltage).

In FIG. 1, a typical DRAM memory cell 8 consists of a storage capacitor 10 and an access transistor 12. Although the conventional DRAM memory cell 8 is well known, the following description is provided for completeness. The access transistor 12 is typically a n-channel MOSFET, with one source/drain (S/D) node 11 being connected to a node 17 of the capacitor 10. The node 17 is referred to herein as the storage node. The other S/D node 13 of the access transistor 12 is connected to a bitline 14. The gate 15 of the access transistor 12 is connected to a word line 16. The other node 18 of the capacitor 10 is connected to a cell plate (not shown), which has impressed thereon a reference voltage Vcp.

In order to reduce leakage caused by wordline disturbance, a high threshold-voltage (Vt) access transistor can be used to reduce subthreshold current. However, this type of transistor is relatively slow, making its use as an access transistor undesirable. Another conventional method impresses a negative bias on the wordline when the wordline is not being accessed. More specifically, a negative voltage is applied to the wordline 16 to reverse bias the gate-to-source junction of the access transistor 12, thereby preventing the access transistor from conducting. This scheme is described in more detail in conjunction with the timing diagram of FIG. 2.

With reference to FIGS. 1 and 2 the negative bias wordline scheme is performed as follows. During a time period T1, the DRAM cell is in the active mode, being accessed in either the access mode or the refresh mode. During the active mode, a positive voltage is impressed on the word line 14, thereby causing the access transistor 12 to become conductive. Typically, this positive wordline voltage is greater than the NMOS "drain" voltage VDD provided by a VDD voltage source (not shown). Then, depending on the voltage on the bitline 14, the capacitor 10 is either charged to a voltage approximately equal to VDD or discharged to a voltage approximately equal to the NMOS "source" voltage VSS. In this conventional scheme, the cell plate voltage Vcp is typically maintained at a value of ½VDD for all operations. Thus, the voltage across the capacitor 10 is about +½VDD when storing a high voltage and about zero when storing a low voltage.

Then during a time period T2, the DRAM cell is not accessed. A negative voltage is impressed on the wordline 16. Because the gate 15 is connected to the wordline 16, the resulting negative gate voltage provides a large noise margin, thereby reducing leakage caused by wordline disturbance.

One disadvantage of this scheme is that extra control circuitry is required to provide the negative voltage to each of the wordlines. Because DRAM devices typically have a large number of wordlines, a significant amount of area is needed to provide this extra control circuitry. In addition, a relatively large amount of power is dissipated to pull the wordlines to below Vss. Moreover, because the backbias voltage generator is typically used to provide the negative voltage to cell plate, discharging the wordlines undesirably introduces a significant amount of noise into the backbias voltage −Vbb and disturbs memory cells through cell plate.

A further problem arises in the presence of a bitline-to-wordline short (cross-fail), which causes the memory cells connected to the shorted wordline or bitline to malfunction. A cross-fail may exist in a DRAM because redundancy circuits are often used to replace memory cells affected by cross-fail.

The cross-fail increases the power dissipation of the DRAM as current is conducted from the precharge circuit (not shown), the shorted bitline, the shorted wordline and the wordline pulldown transistor. The cross-fail increases more leakage because the wordlines are pulled down to the backbias voltage −Vbb instead of ground. This causes the gate-to-source voltage of the pull-down transistor to increase, resulting high stand by current of the device. To reduce leakage current to a reasonable level, the width of the wordline pull-down transistor is typically reduced to the minimum device size. A long channel pulldown transistor may be necessary to reduce the leakage to a tolerable level. But the weaker pull-down transistor causes pull-down operation to become slower.

Alternatively, cross-fail leakage may be reduced by using a pulsed precharge scheme. In this scheme, the bitlines are precharged to the predefined voltage level for a limited duration before the memory access. Although this scheme reduces the cross-fail leakage, the bitline is undesirably left floating when there is no memory access.

SUMMARY

In accordance with the present invention, a method and structure are provided for improving data retention in a DRAM. In one embodiment, a configurable voltage generator is used to control the cell plate voltage Vcp to eliminate the need to negatively bias the wordline during the sleep mode. The configurable voltage generator causes the cell plate voltage Vcp to be at the standard ½VDD voltage level when the memory cell is in the access mode or in the refresh mode. However, the voltage generator causes the cell plate voltage Vcp to increase to approximately VDD otherwise.

When the voltage Vcp is increased to VDD, the other node of the capacitor (i.e., the storage node) is then increased by ½VDD. For example, if the capacitor is storing a low voltage (i.e., the voltage across capacitor is −½VDD), the voltage of the storage node rises from a voltage of VSS to ½VDD as the cell plate voltage is increased from ½VDD to VDD. Then when the bitline is precharged to a voltage of ½VDD, the source and the drain of the access transistor are at the same potential and, thus, no charge will leak into or out of the capacitor. Accordingly, leakage is suppressed even if the wordline voltage rises beyond the threshold voltage of the access transistor, thereby sustaining a solid "0".

In contrast, if a high voltage is stored in the cell capacitor (i.e., the voltage across the capacitor is +½VDD), the voltage at the storage node rises to 1½VDD when the cell plate voltage Vcp rises from ½VDD to VDD. Then when the bitline is precharged to a voltage of ½VDD, the gate-to-source voltage of the access transistor becomes −½VDD, which provides a good noise margin. Thus, the memory cell achieves a relatively strong immunity to wordline disturbance.

Because the cell plate voltage in this embodiment is configurable, only a single voltage control circuit is needed, unlike the control circuit per wordline required by the aforementioned negatively biased wordline scheme. In addition, a simple control circuit is used to control the cell plate voltage. Further, because the wordline voltage is not pulled down to −Vbb, the leakage and power dissipation caused by cross-fails are reduced without leaving the bitlines floating, unlike the aforementioned pulsed precharge scheme.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
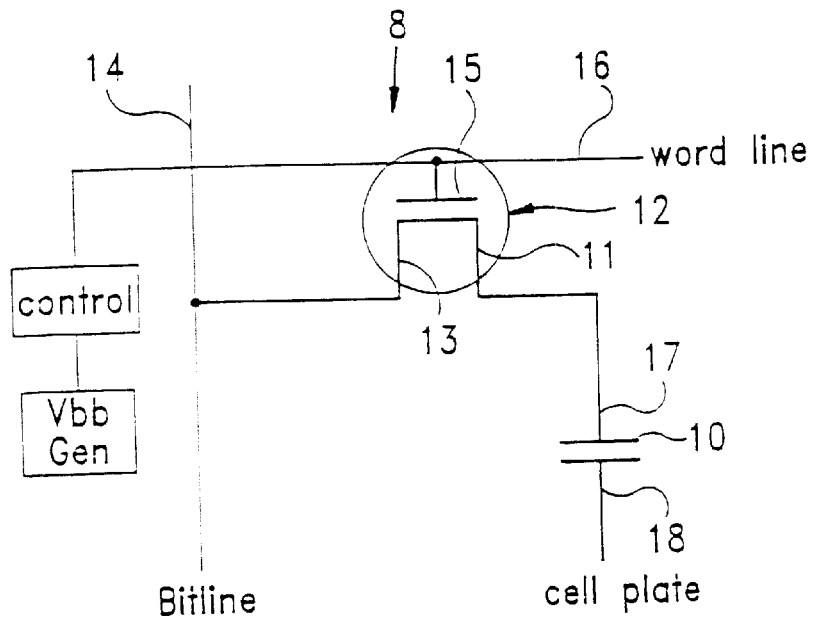
FIG. 1 is a circuit diagram schematically illustrating a conventional DRAM cell and wordline bias control.
Figure 2:
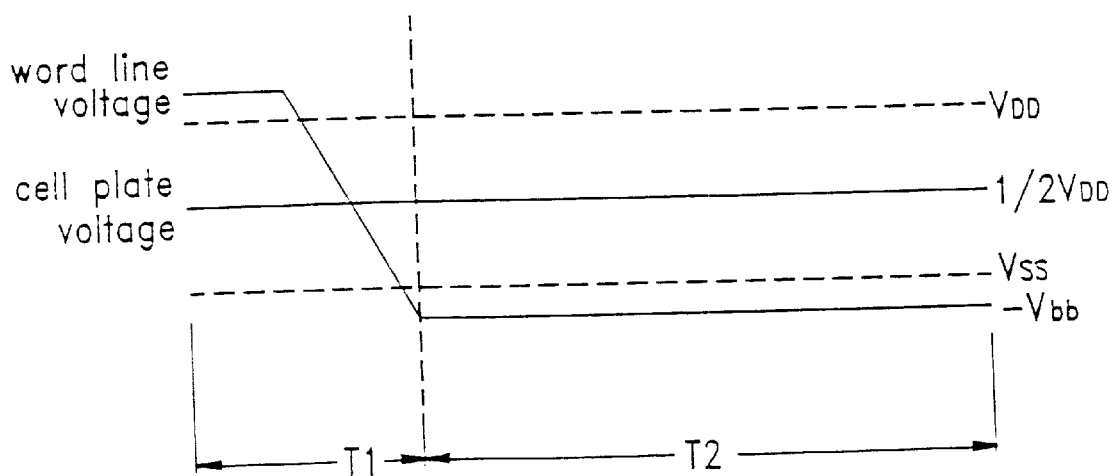
FIG. 2 is a timing diagram illustrating the operation of the memory cell of FIG. 1 using a negatively biased wordline scheme.
Figure 3:
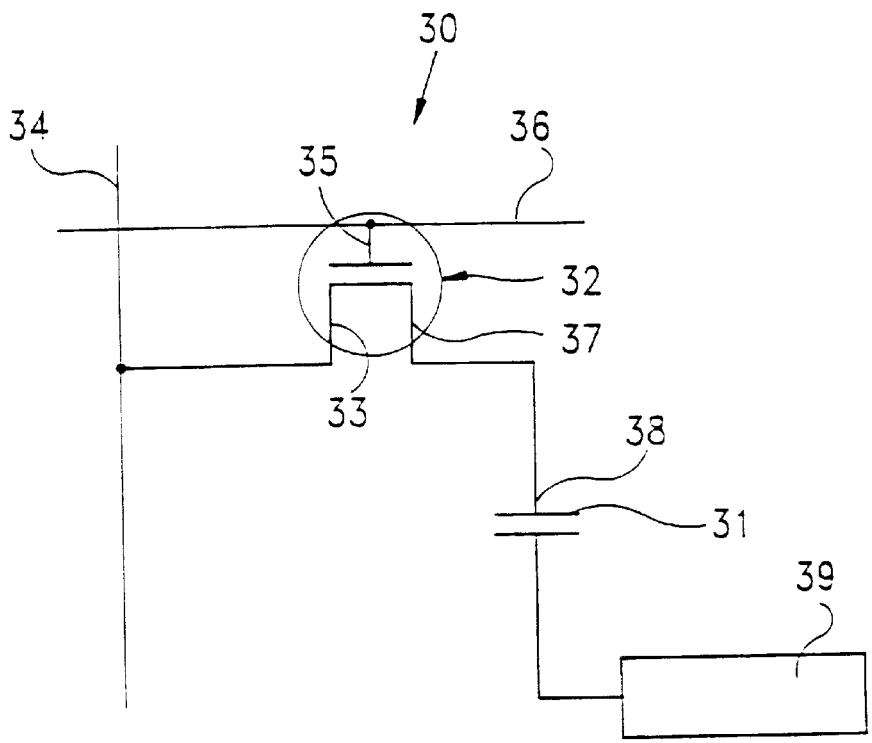
FIG. 3 is a circuit diagram schematically illustrating a DRAM cell according to one embodiment of the present invention.

FIG. 3 schematically shows a memory cell 30 according to one embodiment of the present invention. The memory cell 30 includes a capacitor 31 and an n-channel MOSFET 32. The MOSFET 32 has a S/D node 33 connected to a bitline 34, a gate node 35 connected to a wordline 36, and a S/D node 37 connected to the storage node 38 of the capacitor 31. The other node of the capacitor 31 is connected to a configurable voltage generator 39, which provides the cell plate voltage Vcp. The Vcp generator 39 is configured to provide the cell plate voltage Vcp at a value of ½VDD when the memory cell 30 is being accessed (i.e. either the access mode or the refresh mode), and a value of VDD when the memory cell 30 is not being accessed.

Figure 4:
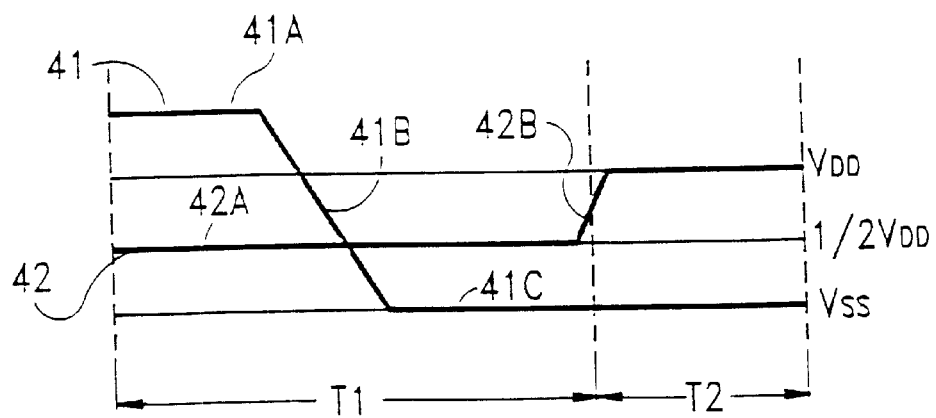
FIG. 4 is a timing diagram illustrating the operation of the memory cell of FIG. 3 using a cell plate voltage scheme, according to one embodiment of the present invention.

FIG. 4 is a timing diagram illustrating the operation of the memory cell 30, according to one embodiment of the present invention. The waveforms 41 and 42 represent the wordline voltage and the cell plate voltage, respectively. With reference to FIGS. 3 and 4, the memory cell 30 operates as follows. The memory cell 30 is in the active mode during a time period T1. To access the memory cell 30, the voltage on the wordline 36 is charged to a positive value greater than the VDD voltage (indicated by portion 41A of the waveform 41) and the cell plate voltage Vcp is maintained at a ½VDD voltage (indicated by the portion 42A of the waveform 42), just as those in a conventional memory cell access.

However, after the memory cell is accessed, the wordline 36 is discharged to a VSS voltage level (indicated by portions 41B and 41C of the waveform 41), unlike one of the prior art, which discharges the wordline to a −Vbb voltage. The cell plate voltage remains at the VSS voltage level during the time period T1. Because the wordline 36 is discharged to a VSS voltage level, no additional noise is introduced into the backbias voltage −Vbb.

At the beginning of the time period T2, configurable voltage generator 39 causes the cell plate voltage to increase to a VDD voltage level, as indicated by the portion 42B of the waveform 42. The voltage of the wordline 36 remains at the VSS voltage level.

Because the cell plate voltage Vcp is increased from ½VDD to a VDD voltage level, the voltage of the storage node 38 increases by ½VDD. Thus, if the capacitor 31 is storing a low voltage (i.e., the voltage of the storage node 38 was at the VSS voltage prior to the time period T2), the voltage of the storage node 38 increases to a voltage of ½VDD. Consequently, as the bitline 34 is precharged to a voltage of ½VDD, the S/D nodes 33 and 37 of the access transistor 32 are at the same potential. Accordingly, no significant current will flow through the access transistor 32 even if the voltage of the wordline 36 rises beyond the threshold voltage of the access transistor 32, thereby eliminating channel leakage.

If a high voltage (i.e., the voltage of the storage node 38 was at the VDD voltage prior to the time period T2), the voltage of the storage node 38 increases to a voltage of 1½VDD. As the bitline 34 is precharged to a voltage of ½VDD, the S/D node 33 of the access transistor 32 also is precharged to this ½VDD voltage. Because the wordline 36 is kept at the VSS voltage level, the gate-to-source voltage of the access transistor 32 is approximately −½VDD, which provides a high noise margin. Accordingly, the memory cell 30 is strongly immune to wordline disturbance.

It will be appreciated that raising cell plate voltage does not stress the capacitor 31 because the voltage across the capacitor 31 remains the same. Thus, there is no significant effect on the reliability of the capacitor 31. The configurable voltage generator 39 is relatively simple because only two readily available voltages need to be provided to the cell plate. One embodiment of the configurable voltage generator 39 is described below in conjunction with FIG. 5. In addition, the voltage of the bitline 34 is not left floating, as in one aforementioned pulsed precharge scheme. Still further, because the wordline is not pulled down to the −Vbb voltage, the leakage and power dissipation caused by cross-fails are reduced.

Figure 5:
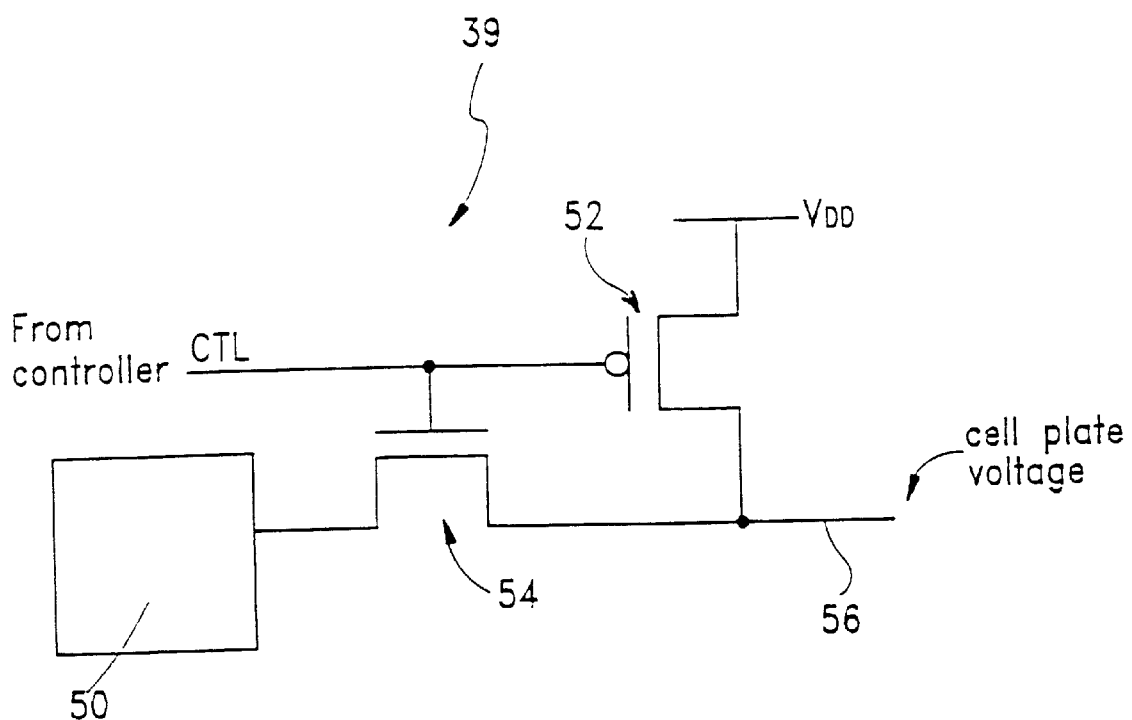
FIG. 5 is a circuit diagram schematically illustrating a configurable voltage generator for use in the memory cell of FIG. 3, according to one embodiment of the present invention.

FIG. 5 schematically shows one embodiment of the configurable voltage generator 39, according to the present invention. The configurable voltage generator 39 is essentially the Vcp voltage generator of conventional memory cell structures with the addition of two transistors. More specifically, the configurable voltage generator 39 includes a voltage source 50 providing a voltage of ½VDD, a p-channel transistor 52, and an n-channel transistor 54.

The source of the p-channel transistor 54 is connected to VDD voltage source receive the VDD voltage and the drain is connected to node 56 of the configuragle voltage source 39. The node 56 is connected to the capacitor 31 as shown in FIG. 3. The gate of the p-channel transistor 52 is connected to a control signal CTL from a memory controller (not shown). When the control signal CTL is deasserted, the p-channel transistor 52 is turned on, thereby pulling the voltage at the node 56 up to the VDD voltage. Conversely, when the control signal CTL is asserted, the p-channel transistor 52 is turned off, thereby providing a high impedance between the node 56 and the VDD voltage source.

The gate of the n-channel transistor 54 is connected to receive the control signal CTL. Accordingly, the n-channel transistor 54 is turned on when the p-channel transistor 52 is turned off, and vice versa. When the memory is being accessed, the p-channel transistor 52 is turned off while the n-channel transistor 54 is turned on providing ½VDD voltage to node 56. On the other hand, when the memory is not being accessed, the n-channel transistor 54 is turned off while the p-channel transistor 52 is turned on providing VDD voltage to the node 56. In this embodiment, the p-channel and n-channel transistors 52 and 54 are MOSFETs, although other transistor technologies can be used in other embodiments.

As is understood by a person skilled in the art, the foregoing embodiments are illustrative of the present invention rather than limiting of the present invention. For example, different configurable voltage sources may be used in other embodiments of the present invention. In other embodiments, the configurable cell plate voltage scheme may be combined with a negative wordline bias scheme to provide even greater channel leakage immunity. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A memory cell for use in a DRAM device, said memory cell being accessed through a wordline and a bitline, said memory cell comprising:

a transistor having a first terminal, a second terminal and a third terminal, said first terminal coupled to said wordline and said second terminal coupled to said bitline;

a capacitor having a first electrode and a second electrode, said first electrode coupled to said third terminal of said transistor; and a voltage generator coupled to said second electrode of said capacitor, wherein said voltage generator is configured to provide to said second electrode of said capacitor a first voltage during a first mode and a second voltage during a second mode, said first voltage being different from said second voltage.

2. The memory cell of claim 1, wherein said voltage generator comprises:

an output lead coupled to said second electrode of said capacitor;

a first voltage source configured to provide said first voltage;

a second voltage source configured to provide said second voltage; and a switch coupled to said output lead and said first and second voltage sources, wherein said switch is configured to couple said first voltage source to said output lead during said first mode and to couple said second voltage source to said output lead during said second mode.

3. The memory cell of claim 2, wherein said switch is configured to isolate said first voltage source from said output lead during said second mode and to isolate said second voltage source from said output lead during said first mode.

4. The memory cell of claim 1, wherein said memory cell is configured to be accessed during said first mode.

5. The memory cell of claim 4, wherein said memory cell is refreshed during said first mode.

6. The memory cell of claim 1, wherein said wordline is biased to have a third voltage during said second mode.

7. The memory cell of claim 6, wherein said first and second voltages are greater than said third voltage.

8. The memory cell of claim 7, wherein said third voltage is greater than a backbias voltage of said DRAM device.

9. The memory cell of claim 7, wherein said second voltage is greater than said first voltage.

10. The memory cell of claim 9, wherein said second voltage is about twice as great as said first voltage.

11. The memory cell of claim 2, wherein said switch comprises:

a second transistor coupled to said first voltage source and said output lead; and a third transistor coupled to said second voltage source and said output lead, wherein said second transistor is configured to be turned on when said third transistor is turned off and said third transistor is configured to be turned on when said second transistor is turned off.

12. The memory cell of claim 11, wherein said second transistor comprises an n-channel transistor and said third transistor comprises a p-channel transistor.

13. The memory cell of claim 12, wherein said second and third transistors have gates coupled to receive a control signal, said control signal configured to be at a logic high level during said first mode and a logic low level during said second mode.

14. A method for improving data retention in a DRAM memory cell in a DRAM device, said memory cell having a capacitor configured to receive a cell plate voltage, said memory cell configured to be accessed through a wordline and a bitline, said method comprising:

providing a first voltage to serve as said cell plate voltage during a first mode; and providing a second voltage to serve as said cell plate voltage during a second mode, said second voltage being greater than said first voltage.

15. The method of claim 14, wherein said second voltage is about twice as great as said first voltage.

16. The method of claim 14, further comprising providing a third voltage to said wordline during said second mode, said third voltage being greater than a backbias voltage of said DRAM device.

17. The method of claim 16, wherein said third voltage is about zero volts.

18. A circuit for improving data retention in a DRAM memory cell in a DRAM device, said memory cell having a capacitor configured to receive a cell plate voltage, said memory cell configured to be accessed through a wordline and a bitline, said method comprising:

means for providing a first voltage to serve as said cell plate voltage during a first mode; and means for providing a second voltage to serve as said cell plate voltage during a second mode, said second voltage being greater than said first voltage.

19. The circuit of claim 18, wherein said second voltage has a level that is twice as great as that of said first voltage.

20. The circuit of claim 18, further comprising means for providing a third voltage to said wordline during said second mode, said third voltage being greater than a backbias voltage of said DRAM device.

* * * * *

UNITED STATES PATENT AND TRADEMARK OFFICE
CERTIFICATE OF CORRECTION

PATENT NO. : 6,021,063
DATED : February 1, 2000
INVENTOR(S) : J.-D. Tai

It is certified that error appears in the above-identified patent and that said Letters Patent is hereby corrected as shown below:

COLUMN    LINE

[73]    Assignee    "Vanguard International Semiconductor Corporation"
Pg. 1, col. 1                 should read --Powerchip Semiconductor Corporation--

Signed and Sealed this

Twenty-seventh Day of March, 2001

*Attest:*

NICHOLAS P. GODICI

*Attesting Officer*      *Acting Director of the United States Patent and Trademark Office*